United States Patent [19]

Eckhardt et al.

[11] Patent Number: 4,977,329
[45] Date of Patent: Dec. 11, 1990

[54] ARRANGEMENT FOR SHIELDING ELECTRONIC COMPONENTS AND PROVIDING POWER THERETO

[75] Inventors: Wilfred O. Eckhardt; Weldon S. Williamson, both of Malibu; Donald J. Hancock, Thousand Oaks; Ronald R. Robson, Newbury Park, all of Calif.

[73] Assignee: Hughes Aircraft Company, Los Angeles, Calif.

[21] Appl. No.: 197,237

[22] Filed: May 23, 1988

[51] Int. Cl.⁵ ............................................. G02B 27/00
[52] U.S. Cl. ..................................... 250/551; 307/311
[58] Field of Search ....................... 250/227, 551, 239; 357/19; 455/606, 607, 612, 617; 307/311

[56] References Cited

U.S. PATENT DOCUMENTS

| | | | |
|---|---|---|---|
| 3,521,089 | 7/1970 | Stuetter | 310/321 |
| 3,710,150 | 1/1973 | McMaster | 310/323 |
| 4,104,533 | 8/1978 | Iverson | 250/551 |
| 4,213,119 | 7/1980 | Ward et al. | 340/870.29 |
| 4,243,890 | 1/1981 | Miller et al. | 250/551 |
| 4,298,839 | 11/1981 | Johnston | 250/551 |
| 4,429,231 | 1/1984 | DeLoach, Jr. et al. | 250/551 |
| 4,481,423 | 11/1984 | Conway | 250/551 |
| 4,570,079 | 2/1986 | Davis | 250/551 |
| 4,651,571 | 3/1987 | McGalde | 340/870.28 |
| 4,719,358 | 1/1988 | Matsumoto et al. | 250/551 |
| 4,810,891 | 3/1989 | Maschek et al. | 250/227 |

FOREIGN PATENT DOCUMENTS 0260238 3/1988 European Pat. Off. .
3507926 9/1986 Fed. Rep. of Germany .
3215345 11/1988 Fed. Rep. of Germany .

Primary Examiner—David C. Nelms
Assistant Examiner—Stephone B. Allen
Attorney, Agent, or Firm—V. D. Duraiswamy; P. M. Coble; W. K. Denson-Low

[57] ABSTRACT

Disclosed herein is an arrangement for shielding individual electronic units from undesired microwave or millimeter wave radiation while providing a means of transferring input and output signals and operating power through the shield wall. A metal box encapsulates an electronic unit. Input and output signals are fed into and transferred from the electronics unit through the shield wall using optical links and photo transmitting and receiving components. Power is transferred through the shield box wall using piezo crystals secured to the outside and inside of the shield box wall and a dielectric rod connected between the two piezo crystals through a hole in the wall. Electrical energy therefore can be transferred into mechanical energy transferred through the box wall to the piezo crystal within where it is received and transferred back into electrical energy. Accordingly, metal feedthroughs are not needed, eliminating any paths for radiation to enter the shield box.

9 Claims, 3 Drawing Sheets

ARRANGEMENT FOR SHIELDING ELECTRONIC COMPONENTS AND PROVIDING POWER THERETO

BACKGROUND OF THE INVENTION

1. Field of the Invention

This invention relates generally to radiation damage protection and more particularly to arrangements for shielding electronics from damaging microwave and millimeter wave radiation and providing power and control signals thereto without metallic feed throughs.

2. Statement of Related Art

Electronic components are basic elements in radar systems, communication systems, guidance mechanisms, aircraft, and surveillance equipment deployed throughout the earth's environment and also in space. Electronic components (especially VLSI circuits) are fragile and susceptible to disorientation or destruction by undesirable concentrated pulses of microwave or millimeter wave radiation. For example, naked electronic components could be irradiated with sufficient microwave energy from a traveling-wave tube to damage them.

Traditional techniques of electromagnetic protection and hardening, although useful, do not seem adequate. Electrical wires and mechanical shafts that feed through the traditional metal shield box encapsulating an electronics unit provide paths for electromagnetic radiation to enter the electronics unit and damage components therein. Improved devices, therefore, are needed to protect electronic components from undesired electromagnetic radiation that could be directed on such components and damage them. Furthermore, these devices must be able to protect electronic components over quite a broad bandwidth, preferably including both microwave and millimeter wave ranges. Any shielding arrangement must also allow sufficient power to pass therethrough to enpower electronics components therein without providing a path for undesired radiation to enter through the shield. Additionally, the shielding arrangement must allow input signals to pass therein to control the operation of any electrical components and allow output signals to pass out of the shield without metallic feedthroughs.

SUMMARY OF THE INVENTION

It is therefore an object of the present invention to provide a shielding arrangement capable of shielding electronic components from concentrated microwave and millimeter wave radiation.

It is a further object of the present invention to provide a shielding arrangement without metallic feedthroughs.

It is a feature of this invention to have optical links which permit output and input signals to pass through a metallic shield, eliminating electrical feedthroughs.

It is a further feature of this invention to have an arrangement of piezo crystals and dielectric elements for transmitting energy through a metallic shield eliminating the need for electrical feedthroughs.

A shielding arrangement for protecting sensitive electronic components from undesired microwave and millimeter wave radiation includes a metallic structure encapsulating the electronic components. Power transferring means are provided for transferring input and output signals into and out of the encapsulating metallic structure and further for transporting energy through the encapsulating metallic structure to supply electrical energy to the electronic components.

One such power transferring means includes optical fiber links. Electrical input signals generated outside the encapsulating metallic structure are converted into light signals and are transmitted into the metallic structure by a fiber optic guide which passes through a small channel in the metallic structure. Once inside the metallic structure, the light signal are converted back to electrical signals, using either a photoelectric or photovoltaic device. Electrical output signals generated by any electrical components within the metallic structure can similarly be converted to light signals and transmitted out of the structure.

In another aspect, the power transferring means includes a piezo crystal inside the metallic structure and another piezo crystal outside the structure. Mechanical power is transferred from the piezo crystal outside the metallic structure to the piezo crystal inside the structure through a dielectric medium positioned between the vibrating surfaces of the two crystals. Accordingly, a voltage is derived from the piezo crystal inside the metallic structure which provides electrical energy for electronic components therein.

Other and further objects, advantages and characteristic features of the present invention will become readily apparent from the following detailed description of preferred embodiments of the invention when taken in conjunction with the appended claims.

DETAILED DESCRIPTION

Figure 1:
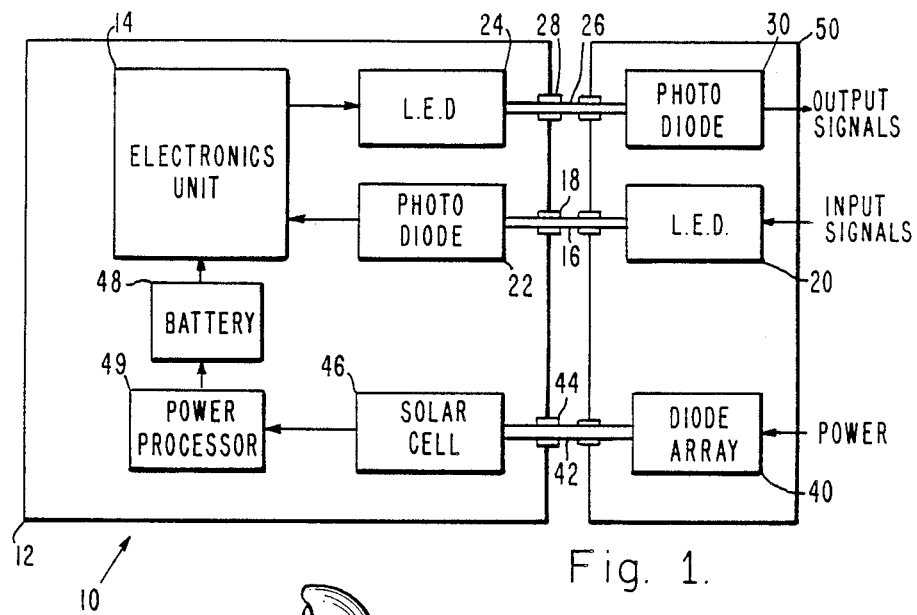
FIG. 1 is a block diagram of a shielding arrangement according to the invention.

Referring with greater particularity to FIG. 1, a shielding arrangement according to the invention is illustrated with the basic elements of a preferred shielding arrangement for protecting electrical components of an electronics unit.

Shield box 12 encapsulates an electronics unit 14, the electronics unit including electrical components to be shielded from undesired high power radiation. Shield box 12 is made of conductive material such as metal which blocks concentrated pulses of microwave or millimeter wave radiation. The wall thickness of the shield box may be many skin depths to assure adequate attenuation of incident radiation, thereby forming a Faraday shield.

Input signals needed for the operation of the electronics unit are transmitted to the electronics unit via fiber optic guide 16 which passes through a small cylindrically shaped waveguide 18 positioned in the wall of shield box 12. Waveguide 18 has a diameter such that its cutoff wavelength is considerably below the shortest wavelength of any undesired microwave or millimeter wave radiation. Details in selecting the appropriate diameter and length of waveguide 18 are well known in the art. Input signals are electrical signals generated outside shield box 12. These electrical signals are fed into light emitting diode 20 which converts any electrical signal into a light signal. The light signal emitted by diode 20 is transmitted through fiber optic guide 16 and impinges on receiving photodiode 22. Receiver photodiode 22 converts the impinging light signal back to an electrical signal which is transmitted therefrom to the electronics unit 14 by electrical wires.

In a similar manner output signals generated by electronics unit 14 may be transmitted out of shield box 12. For example, an electrical output signal may be electrically coupled from the electronics unit to another light emitting diode 24 which converts this electrical signal into a light signal. Fiber optic guide 26 receives the light signal generated by diode 24 and carries output light signal through waveguide 28 extending through the wall of the shield box 12. The output light signal impinges on the light receiving surface of photodiode 30 positioned outside shield box 12 and is thereby converted into an electrical signal for further signal processing elsewhere.

Optical fiber links can also be used to provide energy to the electronics unit. For example, a power supply (not shown) generates electrical power signals which are electrically coupled to a light emitting diode device 40, such as a diode array or laser diode array. Diode array 40 converts the electrical power signals to light which is coupled into fiber optic guide 42. Fiber optic guide 42 extends from diode array 40 through a waveguide 44 in shield box 12. The waveguide dimensions are selected in accordance with the same rules as stated above for waveguide 18. Fiber optic guide 42 terminates adjacent to solar cell 46, the front light receiving surface of the solar cell being oriented essentially normal to the light emitting end face of fiber optic guide 42. Consequently, light from the fiber optic guide 42 impinges on solar cell 46 which in turn converts this light energy into an electrical current output. The electrical current output from solar cell 46 is typically not sufficient to directly supply electronic components with sufficient power. Therefore, the output of solar cell 46 may be stored in a battery. Accordingly, solar cell 46 is connected to charging regulator or power processor 49 which controls the rate at which the solar cell current is fed into battery 48. Electrical energy is thereby stored in battery 48 which may be drawn upon by the electronics unit 14 to supply electrical energy to the components therein.

Consequently, by using light as the power transfer medium, an electronics unit can be empowered without the need for electrical or mechanical feedthroughs. For protection, light emitting diodes 20 and 30 and diode array 40 may also be encapsulated in another metallic shield box 50, for example. Fiber optic guides 16, 26 and 42 can advantageously be up to several hundred meters or more long if the various shield boxes should be widely separated. Fiber optic guides are also flexible so that they can bend and wind along almost any desired path.

Figure 2:
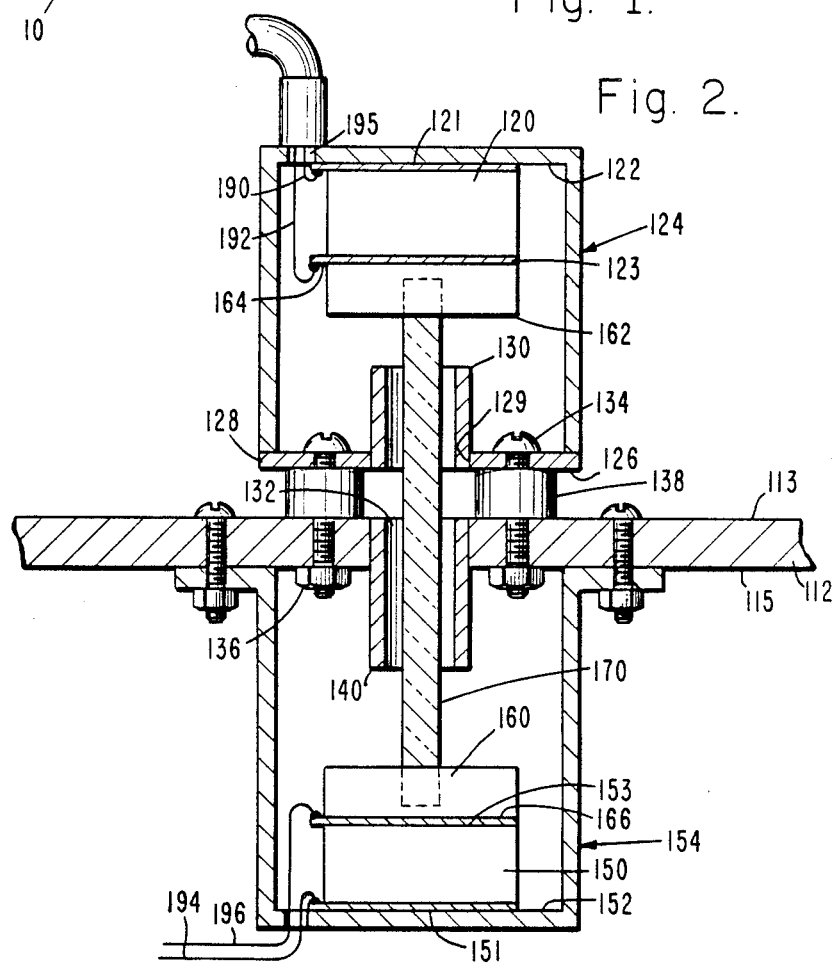
FIG. 2 is a cross-sectional side view showing one means of transferring power through the wall of a shield box.

In an alternative embodiment, ultrasonic vibration in a dielectric rod can be employed to transfer power into a shield box with electronics therein. For example, in FIG. 2, on the outside of shield box 112, a transmitter or driver piezo crystal 120 is securely attached to the inner bottom surface 122 of metallic cylindrical cup 124. The transmitter piezo crystal 120 may be made of lead zirconate or barium titanate, for example, and has two flat metallic contacts 121 and 123 disposed on its front and back essentially parallel major surfaces. Crystal 120 may be bonded to the bottom surface 122 of cup 124. A metallic plate 126 in the shape of a flat washer is attached to the upper lip 128 by soldering or welding, for example. A short length of tube 130 which serves as a waveguide beyond cutoff is attached to the annular inner surface 129 of washer plate 126. Transmitter piezo crystal 120 and tube 130 are coaxially aligned. Cylindrical cup 124 is mounted onto the outer wall 113 of shield box 112 over hole 132 by, for example, insulating bolts 134 and nuts 136 which may be nylon, and dielectric spacers 138. In applications where a stronger fastening means is required bolts and nuts 134 and 136 may be metal but electrically isolated from shield box 112 by dielectric washers and sleeves (not shown), for example. Alternatively, dielectric spacers 138 could be replaced with dielectric standoffs having female threaded holes at both ends. Accordingly, washer plate 126 could be bolted to one end of the standoffs by a first plurality of screws, and shield box 112 bolted to the other end of the standoffs by a second like plurality of screws. Another short length of tube 140 is mounted in hole 132 which also serves as a waveguide beyond cutoff. The inner diameter of tubes 130 and 140 are selected to have a cutoff wavelength to be considerably below the shortest wavelength of undesired microwave or millimeter wave radiation.

On the inside of the shield box, a receiver piezo crystal 150 is securely attached to the inner bottom surface 152 of a rigid U-shaped strap 154, by bonding for example. The receiver piezo crystal may also be made of lead zirconate or barium titinate, for example, and has two flat metallic contacts 151 and 153 disposed on its front and back major surfaces, respectively. The feet of the U-shaped strap 154 are bolted to the inner wall 115 of shield box 112 so that receiver piezo crystal 150 is axially aligned with transmitter piezo crystal 120. Washers 160 and 162 are coaxially mounted onto the front major surfaces 164 and 166 of crystals 120 and 150, respectively by bonding, for example. Dielectric rod 170 extends between crystals 120 and 150, each one of the ends of the rod 170 being inserted into the holes in washers 160 and 162 respectively, and rigidly attached thereto by bonding, for example. Dielectric rod 170 may be made of glass or ceramic material having low internal attenuation for acoustical waves, for example.

To excite the transmitter piezo crystal 120, wires 190 and 192 are electrically coupled to flat contacts 121 and 123 respectively, and extend out through a small hole 195 in cup 124 to an external source of power (not shown). To derive a voltage from the receiver piezo crystal 150, wires 194 and 196 are electrically coupled to flat contacts 151 and 153, respectively, and extend to an electronics unit (not shown) within the shield box. Accordingly, an external voltage from a power supply (not shown) is applied through wires 190 and 192 to transmitter piezo crystal 120. The front major surface 164 of transmitter piezo crystal vibrates axially back and forth causing dielectric rod 170 to vibrate along its longitudinal axis. The mechanical vibration of rod 170 vibrates front major surface 166 of receiver crystal inducing a voltage across wires 194 and 196. This voltage is fed to any electronic unit within the shield box providing the desired power thereto.

Figure 3:
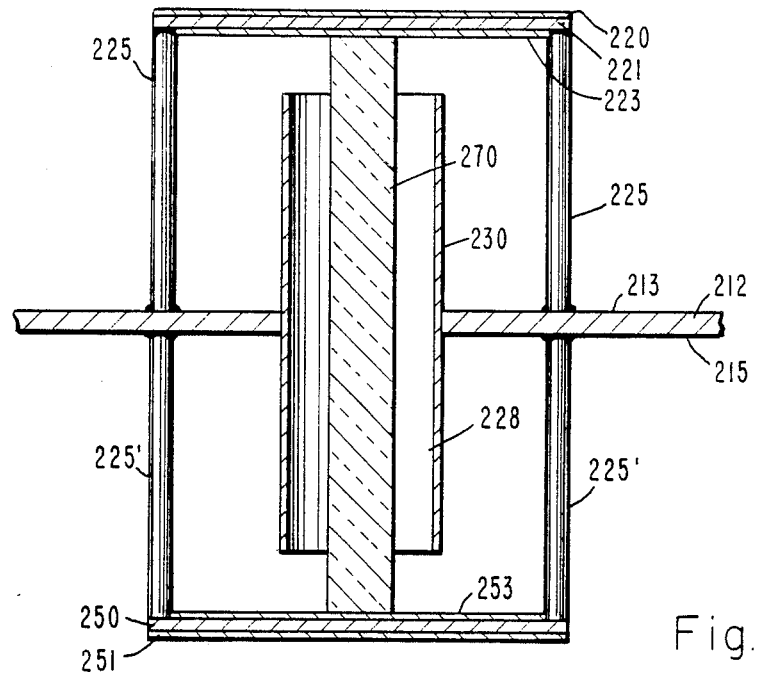
FIG. 3 is a cross-sectional side view illustrating another embodiment for transferring power through the wall of a shield box.

Other types of piezo crystals may be used to transmit and receive mechanical power. For example, piezo motors and piezo generators can be used to generate and receive mechanical power through a dielectric medium. Instead of the longitudinal back and forth motion, however, mechanical rotational motion is induced by the piezo crystals. Alternatively, piezo bender (slab or ring type) transducers may be employed to transform the energy as shown in FIG. 3. A transmitter piezo bender 220 that is substantially rectangularly shaped has thin metal membranes 221 and 223 electrically coupled to the front and back major surfaces of the bender. Four dielectric posts 225 are attached to the four corners of the front major surface of the transmitter bender by bonding, for example. The four posts 225 are also securely attached to the outer wall 213 of a shield box 212 by soldering, for example. Mounting brackets, however, may also be used. Opposite transmitter piezo bender 220, a rectangularly shaped receiver piezo bender having thin metal membranes 251 and 253 is similarly mounted on four dielectric posts 225'which are in turn securely attached to the inner wall 215 of shield box 212. Between the piezo benders is a hole 228 in the wall of shield box 212 which has a short length of tubing extending therethrough serving as waveguide beyond cutoff (as described above) to block undesired radiation from entering the shield box. A dielectric rod extends between benders 220 and 250 through hole 228, and is soldered to the thin metal membranes 223 and 253.

Alternatively, instead of using a solid dielectric material between transducers to transfer mechanical power, liquid can be employed as the medium to transfer energy from a first transmitter piezo crystal outside the shield box to a receiving piezo crystal. For example, a hollow tube filled with low viscosity fluid may extend between a piezo transmitter and a piezo receiver. Matching interface couplers may be attached to the crystals.

Figure 4:
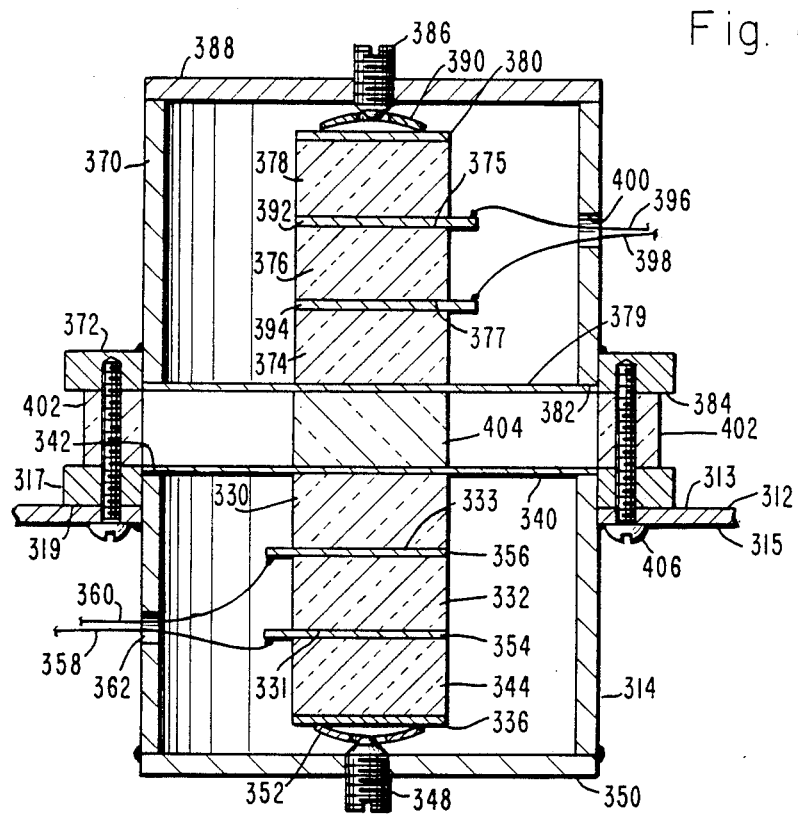
FIG. 4 is a cross-sectional side view illustrating still another embodiment for transferring power through a shield box.

FIG. 4 illustrates a further embodiment of the invention. In this shielding arrangement, a first cylindrically shaped metal cup 314 has a metal ring 317 attached to its annular outer lip, both of which may be brass for example. First cup 314 is slid into a hole in shield box 312 such that back surface 319 of metal ring 317 sits adjacent to the outer surface of wall 313 of shield box 312.

Dielectric disc 330, receiver piezo crystal 332, dielectric disc 344 and stainless steel disc 336 are stacked coaxially one on top of the other inside cup 314. The flat surfaces of dielectric discs 332 and 344 are metallized and the respective parts of the stacked assembly, namely dielectric rod 330, piezo crystal 332 and dielectric disc 344 and disc 336 are all securely attached together by solder, for example. A thin membrane 340 in the shape of a disc, which may be flat or corrugated copper for example, sits on the annular upper lip 342 of cup 314 and is attached to ring 317 by solder, for example. Thin membrane 340 is also attached to disc 330 by soldering for example. First adjustable screw 348 extends through a threaded hole in the bottom 350 of cup 314 and supplies pressure through spring washer 352 on stainless steel disc 336 and in turn piezo crystal 332 which pressure tends to keep the back surface 331 of piezo crystal 332 from vibrating so that substantially all the mechanical vibration of piezo crystal 332 occurs at its front surface 333. Flat contacts 354 and 356 are electrically coupled to the front and back surfaces of receiver crystal 332 and provide the means for deriving a voltage from this crystal. Wire pair 358 and 360 are electrically coupled to flat contacts 354 and 356 respectively, and extend through a small hole 362 in the side of cup 314.

A second cylindrically shaped metal cup 370 has a second ring 372 attached to its annular outer lip by brazing, for example. Dielectric disc 374, transmitter piezo crystal 376, dielectric disc 378 and stainless steel disc 380 are coaxially stacked against each other inside second cup, and attached together by soldering, for example. Another thin disc shaped membrane 379 sits on the annular upper lip 382 of second cup 370 and is attached onto the upper surface 384 of copper ring and also dielectric disc 374 by soldering, for example. Second adjustable screw 386 extends through a threaded hole in the bottom 388 of second cup 370 and adjustably supplies a longitudinal axially pressure through spring washer 390 on stainless steel disc 380 which in turn tends to keep the back surface 375 of crystal 376 from vibrating so most of the mechanical vibration occurs at front surface 377. Flat contacts 392 and 394 are electrically coupled to front and back surfaces of transmitter crystal 376, and provide the means for applying a voltage to these surfaces. Wires 396 and 398 are electrically coupled to flat contacts 392 and 394 respectively and extend through a small hole 400 in the side of second cup 370, to an external power source (not shown).

Second cup 370 is stacked over first cup 314 separated by a plurality of dielectric standoffs 402 and intermediate dielectric disc 404. A like plurality of insulating bolts 406, made of nylon for example, extend through respective ones of a like plurality of holes in shield box 312 through a like plurality of holes in ring 317 through the dielectric standoffs 402 and into a like plurality threaded holes in second ring 372. Bolts 406 are tightened so that first and second membranes 340 and 379 are pulled into tight relationship with dielectric rod 404. Alternatively insulated sleeves and washers could be used or dielectric standoffs as disclosed above.

In operation a voltage is applied across wires 396 and 398 and thereby to transmitter piezo crystal 376 inducing transmitter crystal 376 to mechanically vibrate in thickness. The vibration of the transmitter piezo crystal 376 is transmitted to disc 374. Disc 374 in turn vibrates membrane 379 which in turn vibrates intermediate disc 404. The vibration of disc 404 is transmitted through membrane 340 to dielectric disc 330. The vibration of disc 330 induces mechanical vibration in receiver crystal 332. The vibration of crystal 332 induces a voltage between contacts 354 and 356 which is carried through wires 358 and 360 through small hole 362 in copper cup 314 to within the shield box. Consequently, a means for getting power through the shield box wall is disclosed which does not allow the penetration of undesired microwave or millimeter wave radiation.

In many instances, it is impractical to provide a shield box to enclose an entire electronics system because of weight problems, structural design problems or functional problems. An alternative would be to shield individual electronic components or larger modules such as VHSIC devices. Arrangements for providing shielding at the electronic component or module level logically extend from the embodiments described above as depicted in the further embodiments shown in FIGS. 5 and 6.

Figure 5:
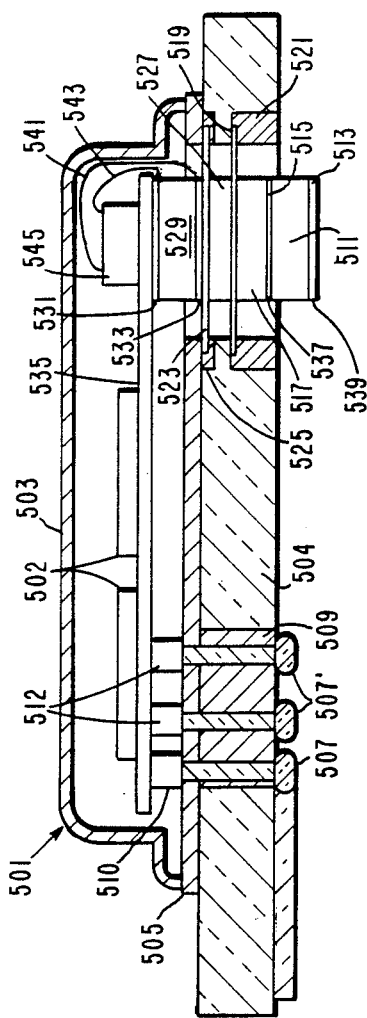
FIG. 5 is a cross-sectional side view illustrating one means of transferring power through a metallic case housing VHSIC chips.
Figure 6:
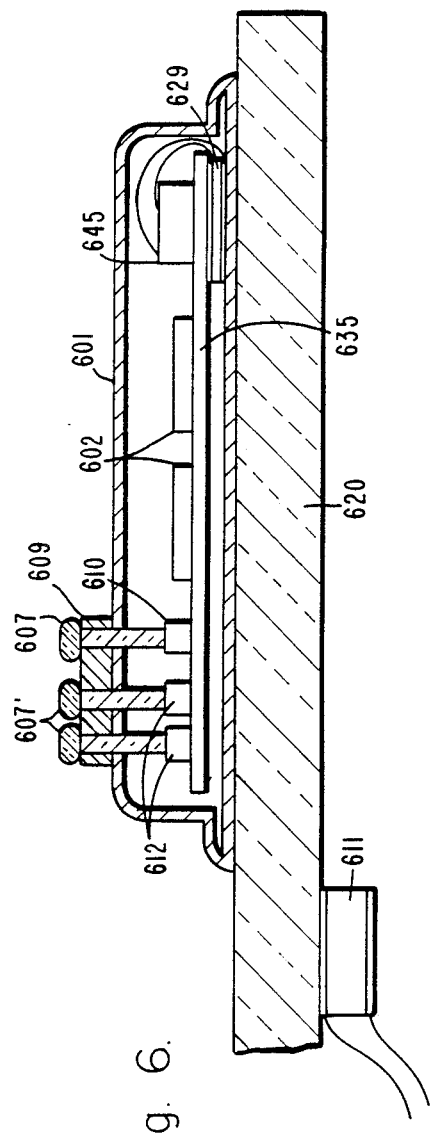
FIG. 6 is a cross-sectional side view of another embodiment for transferring power through the VSHIC metallic case.

In FIG. 5, a metallic case 501 including cover and base 503 and 505 encloses one or more VHSIC chips 502 or other electrical components and provides a Faraday shield to block undesired microwave or millimeter wave radiation. Metallic case 501 is mounted on a dielectric substrate 504. Input and output signals are transmitted through the base 505 of metallic case 501 as light signals through optical fiber guides 507 and 507', respectively. The optical fiber guides 507 may be connected to other modules associated with the overall electronic system. The number of optical fiber guides will, of course, depend on the requirements of the VHSIC chips or other electrical components within the metallic case 501. The optical fiber guides 507 and 507' may be mounted through tubular passageways in metallic interface element 509, which element is embedded in dielectric substrate 504. Passageways in metallic interface element 509 block any undesired microwave or millimeter wave radiation from entering the metallic case 509 because these passageways are waveguides beyond cutoff (as described above). The optical fiber guides may be connected to other modules through a cable bundle. Inside the metallic case 501 photodiodes 510 receive light signals from the optical fiber guides 507 and convert these light signals to electrical signals for use by the VHSIC chips 502. Also, any output signals generated by the VHSIC chips 502 may be converted to light signals by light emitting diodes 512, which may be laser diodes, and transmitted out of the metallic case through fiber optic guides 507'.

A piezo crystal power coupling assembly similar to that described above may be used to transmit power to the VHSIC chips 502 within the metallic case 501. For example, piezo crystal driver 511 having flat electrical contacts 513 and 515 may be free-floating or attached to substrate 504. In either case, piezo driver 511 is attached to metallized dielectric disc 517 by soldering, for example. Dielectric disc 517 is in turn attached to thin metal membrane 519 by soldering, for example, which is in turn connected to ground conductor 521. A second thin metal membrane 523 is attached to metal ring 525 which is in turn connected to base 505 of case 501. Intermediate dielectric disc 527 is sandwiched between and attached to the two metal membranes 519 and 523 by soldering, for example. Piezo receiver crystal 529 having flat contacts 531 and 533 is attached to thin metal membrane 523 and to the bottom of dielectric substrate 535 by soldering, for example. The dielectric substrate 535 serves as the PC board for the VHSIC chips and may be made of Teflon based fiberglass having conductive layers on both sides. Accordingly, the circuit arrangement inside the metallic case 501 may be fabricated using standard circuit board techniques, and off-the-shelf dielectric substrate which is copperclad on both sides, for example.

Piezo driver 511 is electrically powered via wire leads 537 and 539 causing it to reciprocate which, in turn, reciprocates dielectric disc 517 and thin metal membrane 519. The mechanical vibration is transferred by dielectric disc 527 and thin metal membrane 523 to piezo crystal receiver 529 which vibrates inducing a voltage therein which is electrically coupled via wire leads 541 and 543 to power conditioner 545. The power conditioner 545 rectifies and adjusts the voltage to the level appropriate for operating the VHSIC chips, which voltage is transferred to the VHSIC chips through conductor lines (not shown) on the dielectric substrate 535.

Instead of using one piezo crystal power coupling assembly for each VHSIC module, a number of VHSIC modules may be powered using a larger piezo crystal driver and several smaller piezo crystal receivers located within the VHSIC modules. For example, in FIG. 6, an alternate embodiment is illustrated wherein piezo crystal driver 611 is attached to the bottom of a planar sheet 620. Planar sheet 620 may be made of a flat sheet of dielectric material or any other suitable material which provides a good acoustical waveguide. A plurality of metal cases 601 (one shown in FIG. 6) are mounted on the other side of planar sheet 620. Each metal case contains one or more VHSIC chips 602 therein mounted on a PC-type board 635. Optical means as described above including optical fiber waveguides 607 and 607', photodiodes 610 and light emitting diodes 612 may be used to transmit input and output signals through metallic case 601. A piezo crystal receiver 629 is mounted on the inside of metallic case 601 on the bottom thereof by soldering, for example. Piezo crystal receiver 629 may also be mounted to the bottom of PC board 635. Power conditioner 645 is electrically coupled to piezo crystal receiver 629. The bottom of the metallic case where the piezo crystal receiver is mounted is preferably made thin such that it allows transfer of mechanical vibrations therethrough.

In operation electrical power to piezo crystal driver 611 causes planar sheet 620 to mechanically vibrate. The vibration of the planar sheet induces vibration of the piezo crystal receivers 629 located within the metal cases 601. These piezo crystal receivers thereby provide electrical power to power conditioners and ultimately VSHIC chips or other electrical components within the metal cases.

Various modifications may be made to the above described embodiments without departing from the scope of the invention. It should be understood, however, that various changes and modifications to a person skilled in the art to which the invention pertains are deemed to lie within the spirit and scope of the invention as set forth in the following claims.

What is claimed is:

1. An arrangement for separately shielding individual electronics units and transferring input and output signals and power therebetween, comprising:
   a first metallic box encapsulating one electronics unit;
   a second metallic box encapsulating another electronics unit;
   means for transferring control and output signals between the electronics units without providing a path for undesired microwave and millimeter wave radiation to enter the boxes;
   means for optically coupling and transferring energy from one electronics unit to another electronics unit to supply power to the other electronics unit.

2. A shielding arrangement as defined in claim 1 wherein said means for transferring input and output signals includes fiber optic guides between said first and second metallic boxes, a waveguide having a diameter such that the cutoff wavelength of the waveguide is below the shortest wavelength of any undesired microwave or millimeter wave radiation, with at least the fiber optic guide for transferring the input signal passing through said waveguide, and light emitting means and light receiving means located within said metallic boxes and optically coupled to said fiber optic guides for converting and transmitting said signals through said fiber optic guides.

3. A shielding arrangement as defined in claim 2 wherein said light emitting means are light emitting diodes and said light receiving means are photodiodes.

4. An arrangement for shielding electronic components from undesired microwave or millimeter wave radiation, comprising:
   a metallic enclosure for housing said electronic components;
   at least one light emitting diode located outside said metallic enclosure for generating a light signal based on a predetermined electric signal;
   at least one photodiode located within said metallic enclosure for converting light energy to electrical current output for empowering said electronic components;
   at least on fiber optic guide for receiving said light signal from said light emitting diode and transferring said light signal through said metallic enclosure to said photodiode, and
   a waveguide through which said at least one fiber optic guide extends, said waveguide extending through a wall of said metallic enclosure, and having a cutoff wavelength lower than the shortest wavelength of any undesired microwave or millimeter wave radiation.

5. The shielding arrangement defined in claim 4 further comprising:
   at least one light emitting diode located within said metallic enclosure for generating another light signal based on another predetermined electrical signal;
   at least one photodiode located outside said metallic enclosure;
   at least one optical waveguide for receiving said another light signal from said light emitting diode and transferring said another light signal through said metallic enclosure to said photodiode located outside said metallic enclosure.

6. The shielding arrangement defined in claim 5 further including another metallic enclosure for housing said light emitting diode and said photodiode located outside said metallic enclosure.

7. The shielding arrangement defined in claim 5 further including means for transferring mechanical energy from outside said metallic enclosure to within said metallic enclosure.

8. A device for shielding electrical components from undesired electromagnetic radiation and transferring input and output signals thereto and therefrom without electrical feedthroughs, comprising:
   an electrically conductive housing encapsulating the electronical components, said housing having inner and outer surfaces;
   means for optically transferring input and output signals into and out of said housing; and
   means for transferring energy to the electrical components through said housing.

9. A shielding device as defined in claim 8 wherein optical transfer means includes optical fibers extending through said metallic housing, light emitting diodes for converting electrical input and output signals into optical signals which transmitted into and out of said housing by said optical fibers, and photodiodes for receiving optical signals transmitted through said optical fiber and converting said signals back into electrical signals.

* * * * *

UNITED STATES PATENT AND TRADEMARK OFFICE
CERTIFICATE OF CORRECTION

PATENT NO. : 4,977,329

DATED : December 11, 1990

INVENTOR(S) : WILFRIED O. ECKHARDT, et al.

It is certified that error appears in the above-identified patent and that said Letters Patent is hereby corrected as shown below:

Title page, item (75): Inventors, delete "Wilfred" and insert --Wilfried--.

Col. 9, line 16, delete "on" and insert --one--.

Signed and Sealed this

Nineteenth Day of October, 1993

Attest:

BRUCE LEHMAN

Attesting Officer

Commissioner of Patents and Trademarks